United States Patent

Muramatsu et al.

Patent Number: 5,981,301
Date of Patent: Nov. 9, 1999

[54] REGENERATION METHOD AND APPARATUS OF WAFER AND SUBSTRATE

[75] Inventors: Kazuo Muramatsu; Akihiro Kawai; Tsutomu Watanabe; Satoshi Shimamoto, all of Kobe, Japan

[73] Assignee: Kabushiki Kaisha Kobe Seiko Sho, Kobe, Japan

[21] Appl. No.: 08/804,732

[22] Filed: Feb. 21, 1997

[30] Foreign Application Priority Data

Feb. 28, 1996 [JP] Japan ................................. 8-041904

[51] Int. Cl.⁶ ................................................ H01L 21/00
[52] U.S. Cl. ............................ 438/4; 438/959; 438/906
[58] Field of Search ............................. 438/14, 959, 4, 438/906; 451/66

[56] References Cited

U.S. PATENT DOCUMENTS 5,472,371  12/1995  Yamakura et al. ..................... 451/56
5,622,875  4/1997  Lawrence ............................ 438/691

Primary Examiner—John F. Niebling
Assistant Examiner—John Murphy
Attorney, Agent, or Firm—Oblon, Spivak, McClelland, Maier & Neustadt, P.C.

[57] ABSTRACT

A method for regenerating a used wafer or substrate by removing a functional coating film formed on the used wafer or substrate, comprising the steps of:

(a) a step for sorting the used wafer or substrate according to the quality, structure or thickness of the functional coating film;

(b) a step for removing the functional coating film, while in a state of holding the used wafer or substrate, (i) by lapping the objective face of the used wafer or substrate with a hard metal-bonded whetstone while applying an electrochemical in-process dressing, (ii) by polishing the objective face while dropping a fine-particle polishing slurry between a polishing plate provided with a pad and the functional coating film, or (iii) by electrolyzing the functional coating film on the objective face placed opposite to an electrode face in an electrolyte solution at a predetermined voltage;

(c) a step for mechanically removing the functional coating film adhered to the end face at an adequate stage; and (d) a step for washing and drying the used wafer or substrate after removal of the functional coating film.

9 Claims, 2 Drawing Sheets

REGENERATION METHOD AND APPARATUS OF WAFER AND SUBSTRATE

BACKGROUND OF THE INVENTION

1. Field of the Invention

The present invention relates to methods for regenerating wafers and substrates which were used in electric and electronic products such as semiconductor devices, magnetic recording media and optical recording devices, and apparatuses for performing the regeneration methods. In particular, the present invention relates to a method for effectively regenerating process wafers, test wafers and dummy wafers which are produced in semiconductor device production processes and an apparatus useful for performing the regeneration method. Although the present invention is also applicable to substrates other than the wafers set forth above, the present invention will be illustrated with reference to a test wafer as a typical example hereinafter.

2. Description of the Related Art

In semiconductor production lines, many test wafers are used for monitoring film thicknesses at various steps, particle inspections, and as dummy wafers in heating units. These wafers after use are repeatedly regenerated and used by removing functional coating films adhered to the surfaces and end faces, followed by washing.

In a typical conventional regeneration method, the regeneration is performed by the following steps (1) to (8):

(1) A removal step of a functional coating film by etching or double-face lapping;

(2) A removal step of a layer deformed by working by etching if necessary;

(3) A washing step of the wafer after the removal step of the functional coating film;

(4) A bonding step of a plurality of wafers on a high stiffness ceramic plate with wax;

(5) A polishing step of a wafer surface in which a plurality of ceramic polishing plates are loaded into a single-face polishing machine with a large turn table and the wafer surface is polished while a polishing slurry is added to a pad provided with the polishing plate;

(6) A peel off step of the wafer from the ceramic polishing plates;

(7) A washing step of wax (bonding agent) on the back face of the wafer; and (8) A finishing washing step.

The double-face lapping of the step (1) is applied to remove hard films or complicated or multilayer films which cannot be removed by etching. FIG. 1 is a flow chart which illustrates the regeneration process set forth above.

Conventional test wafers were prepared for production of semiconductor devices having low levels of integration and relatively simple coating film structures. These films mainly consist of oxide films, polysilicon films, and aluminum films, and have simple structures consisting of at most 2 or 3 layers. Thus, the conventional regeneration process set forth above can satisfactorily respond to these wafers.

In recent years, levels of integration of semiconductor devices are significantly increasing due to extremely fine production processes. At the same time, various kinds of coating films with complicated structures have been formed on test wafers. For example, various hard coating films composed of W, WSi, TiSi, $Si_3N_4$, TiN or the like have been increasingly used with conventional oxide films, polysilicon films and aluminum films, and the coating films consist of two to five layers for memory functions, or four to ten layers for logic bias functions.

Such circumstances set forth above have revealed that conventional regeneration methods have the following drawbacks (1) through (3):

(1) The surface after etching is extremely nonuniform because various films having different etching rates are complicatedly wired and laminated;

(2) Satisfactory regeneration cannot be achieved due to the residual films which cannot be removed by etching; and (3) Removal of hard films by double-face lapping causes the deformed layer formed during working to embed into the deep inside of the substrate.

Thus, a large working allowance is required to achieve a reusable level of surface smoothness in conventional regeneration processes. In detail, a working allowance of 40 to 60 $\mu$m is required every regeneration process by conventional etching or double-face lapping, thus the number of regeneration cycles is limited to at most two or three. Further, the regeneration processes are inefficient, that is, the extremely smooth surfaces of silicon test wafers, on which functional coating films with thicknesses of at most 0.5 $\mu$m are formed, are roughened by film removal processes and finely smoothed again with a large working allowance.

In conventional finish polishing after the coating film removal, a 6- to 8-inch wafer is bonded with wax to a ceramic plate with an outer diameter of 400 to 500 mm, and four to five ceramic plates are loaded on a large single-face polishing machine to perform a batch polishing process. Such a batch polishing process generally comprises two steps of rough polishing and finish polishing as set forth in FIG. 1, or three steps of rough polishing, preliminary finish polishing and finish polishing.

In these polishing steps, the wafer is uniformly bonded to a ceramic plate then peeled off from the plate. Thus, a large amount of equipment such as a wax mounter and a wax demounter must be provided, and a large amount of facility investment is required, even for the step of bonding the wafer to the ceramic plate.

Another regeneration method is also known, in which a wafer fitted on a glass-fiber reinforced template is polished. Since the template and wafer are fixed to each other in this method, a fraction of slurry may reach the back face of the wafer resulting in contamination, or the pad may crash due to separation of the wafer from the template during polishing.

SUMMARY OF THE INVENTION

It is an object of this invent ion to provide a method for effectively regenerating a wafer and a substrate without the occurrence of drawbacks found in prior art, and an apparatus for performing the regeneration method.

A method in accordance with the present invention for regenerating a used wafer or substrate by removing a functional coating film formed on the used wafer or substrate, comprises the steps of:

(a) a step for sorting the used wafer or substrate according to the quality, structure or thickness of the functional coating film;

(b) a step for removing the functional coating film, while in a state of holding the used wafer or substrate, (i) by lapping the objective face of the used wafer or substrate with a hard metal-bonded whetstone while applying an electrochemical in-process dressing, (ii) by polishing the objective face while dropping a fine-particle polishing slurry between a polishing plate provided with a pad and the functional coating film, or (iii) by electrolyzing the functional coating film on the objective face placed opposite to an electrode face in an electrolyte solution at a predetermined voltage;

(c) a step for mechanically removing the functional coating film adhered to the end face at an adequate stage; and (d) a step for washing and drying the used wafer or substrate after removal of the functional coating film.

In this method, the objective face is preferably mirror-polished by dropping a fine-particle polishing slurry between a polishing plate and the objective face while in a state of holding the used wafer or substrate, after any one of (i) to (iii) of the step (b) set forth above.

The lapping in the step (b)(i) or the polishing in the step (b)(ii) is preferably performed while relatively rotating the lapping or polishing face to the hard metal-bonded whetstone or the polishing plate (including cases that any one of the lapped face, polished face, hard whetstone and polishing plate is fixed).

In detail, the step (b)(i) is preferably performed while rotating the objective face at a rate of 500 to 600 rpm and while applying electrochemical in-process dressing with a cup metal-bonded diamond whetstone having a roughness of #2,000 to 10,000 and rotating at a rate of 500 to 6,000 rpm.

Alternatively, the step (b)(ii) is preferably performed by dropping the fine-particle polishing slurry containing polishing particles with an average size of 10.0 µm or less onto the pad of the polishing slurry while rotating the objective face at a rate of 10 to 200 rpm, and by forcing the objective face onto the pad at a face load of 100 g/cm2 or more while rotating the polishing plate at a rate of 10 to 200 rpm.

The fine-particle polishing slurry preferably contains at least one abrasive grain substance selected from the group consisting of $SiO_2$, $Al_2O_3$, SiC, zirconia, cerium oxide, diamond and colloidal silica. The fine-particle polishing slurry may be an alkaline slurry with a pH of 7.2 or more. The fine-particle polishing slurry may contain hydrogen peroxide.

The fine-particle polishing slurry preferably comprises $Al_2O_3$ polishing particles and a water-soluble inorganic substance being at least one oxidative aluminum salt selected from the group consisting of dichromate, nitrate and chloride.

The pad is preferably a hard pad having a Shore hardness of 40 or more, although various materials such as resin and cloth are used.

An apparatus in accordance with the second aspect of the present invention for regenerating a used wafer or substrate by removing a functional coating film formed on the used wafer or substrate, comprises:

(1) a functional coating film removal unit for removing the functional coating film formed on the used wafer or substrate;

(2) an end coating film removal unit for removing the functional coating film adhered to the end face of the used wafer or substrate; and (3) a surface washing unit for washing the treated face of the used wafer or substrate after removal of the functional coating film.

The apparatus may further comprise (4) a surface polishing unit for mirror-polishing the treated face after the functional coating film is removed.

DETAILED DESCRIPTION OF THE PREFERRED EMBODIMENTS

Figure 1:
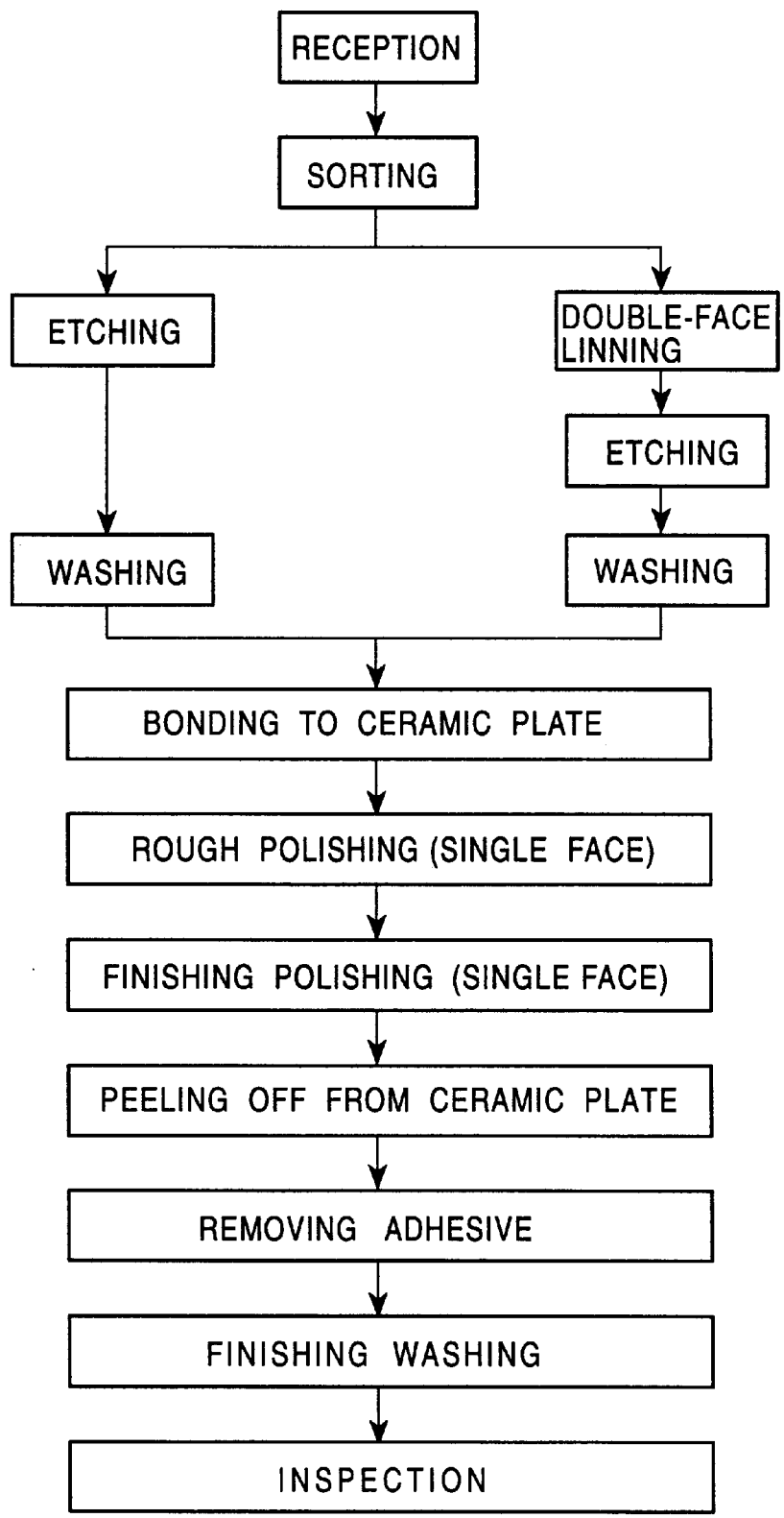
FIG. 1 is a flow chart illustrating a prior art regeneration process.

The present invention was achieved with the following knowledge: When (A) a combination of lapping with a fine particle metal bonded whetstone with electrolytic in-process dressing or (B) high load polishing using a fine whetstone slurry and a hard pad is applied in response to the type of the functional coating film, effective regeneration can be achieved with no wafer damage (i.e., with an extremely low working allowance). The operation of the present invention will be explained with reference to illustrations of individual steps.

The step (a) set forth above is provided for sorting wafers to be treated, according to quality, structure or thickness of the functional coating film. For example, silicon test wafers have various functional coating films formed on their surfaces. Wafer regeneration starts from sorting such wafers into several groups according to the quality, structure, thickness or the like in a reception step. Lapping with a metal bonded whetstone or polishing with a fine particle polishing slurry is determined according to the quality, structure, thickness or the like.

The functional coating film of the wafer sorted in the step (a) set forth above is eliminated in the (b)(i) or (b)(ii) step set forth above while holding the wafer with a chuck. The step (b)(i) is applicable to functional coating films having complicated structures or high hardnesses, while the step (b)(ii) is applicable to those having relatively simplified structures or low hardnesses. The step (b)(iii) is applicable to those including large amounts of metal components such as metal wiring. Functional coating films including large amounts of metal components such as metal wiring inhibit stable working due to seizure of the metal components on the polishing pad and whetstone. Electrolytic working which can directly electrolyze functional coating films is suitable for these coating films. The surface shape of the wafer to be worked is transferred to the electrode surface in electrolytic working. Examples of preferable electrodes include amorphous carbon, glassy carbon and the like which have highly rough surfaces.

A typical example of metal bonded whetstones used in the step (b)(i) is a metal bonded diamond whetstone which has been used in lapping working. When a small diamond particle size is used (for example, #1,000 or more) in prior art lapping processes, the whetstone clogs with the lapped material, resulting in unstable working. In the present invention, such a disadvantage can be prevented by a lapping process which applies electrolytic in-process dressing (ELID). In electrolytic in-process dressing, a voltage is applied to the diamond whetstone during lapping working to electrolytically dissolve metal components as binders and thus, prevent whetstone clogging.

Operation conditions of relative rotation in the step (b)(i) will now be illustrated. A test wafer is held with an air chuck, and the functional coating film is removed by a cup metal bonded diamond whetstone. Working is preferably performed by a metal bonded diamond whetstone rotating at a rate of 500 to 6,000 rpm, while rotating the wafer at a rate of 50 to 600 rpm. Conditions out of these ranges result in deep lapping traces at the surface or chipping. In electrolytic in-process dressing, the coating film can be effectively removed without damaging the wafer when using a metal bonded diamond whetstone having an average particle size of 1 to 8 μm (whetstone roughness: #2,000 to 10,000). An average particle size of over 8 μm forms deep lapping traces on the wafer and deteriorates the surface smoothness, whereas an average particle size of less than 1 μm results in an insufficient electrolytic in-process dressing effect and unstable working.

In cases of wafers having relatively simplified film structures and low hardnesses, polishing using a slurry is selected. Single-face polishing is performed with a fine particle whetstone slurry under a high load using a pad made of a polyurethane resin or the like. For example, a wafer is held with an air chuck and polished with a polishing plate provided with a pad set forth above. The wafer is rotated at a rate of 10 to 200 rpm, a fine particle polishing slurry containing abrasive grains of an average size of 10.0 μm or less is dropped, the polishing plate is rotated at a rate of 10 to 200 rpm, and the wafer is polished while pressing the objective face against the pad with an areal load of 100 g/cm$^2$ or more. The polishing plate is made of, for example, a metallic material, e.g. cast iron or stainless steel, or a ceramic material and is provided with a pad on the surface.

Examples of usable abrasive grain substances for polishing whetstones include $SiO_2$, $Al_2O_3$, SiC, zirconia, cerium oxide, diamond and colloidal silica which have an average size of less than 1 μm. By alkalifying the slurry containing abrasive grains to a pH of 7.2 or more with an alkaline reagent such as KOH or NaOH or adding hydrogen peroxide as an oxidative agent, excellent surface smoothness can be achieved with a high polishing speed due to a mechanochemical effect composed of a mechanical polishing effect by abrasive grains and a chemical polishing effect by such chemical reagents.

In the case of wafers made of hard materials such as glassy carbon and high density amorphous carbon, a fine polishing slurry containing $Al_2O_3$ abrasive grains and at least one water-soluble, oxidative inorganic aluminum salt selected from the group consisting of dichromate, nitrate and chloride is preferably used for achieving an excellent surface smoothness with a high polishing speed due to an excellent mechanochemical effect.

The polishing load and the pad material are important factors for removing the functional coating film in the polishing step. It is preferable for effectively removing the functional coating film that the polishing load be 100 g/cm$^2$ or more, and more preferably 300 g/cm$^2$ or more. A polishing load of over 100 g/cm$^2$ forms deep polishing defects (scratches) on the wafer due to abrasive grains, decreases the polishing speed and significantly decreases productivity. An appropriate pad hardness can decrease polishing speed variation and total thickness variation (TTV) of the wafer, and a reduced TTV and a suitable polishing speed can be achieved with a Shore hardness of 40 or more. Grooves, or circular or oval dimples provided on the pad are also effective in improving the polishing speed.

The functional coating film adhered to the end face of the wafer may be mechanically removed to an adequate stage. An embodiment of such removal is a tape polishing method, in which the end face of the rotating wafer held to the rotation axis is pressed against a tape in which abrasive grains are uniformly dispersed. Removal of the functional coating film may be performed, for example, after sorting wafers, or after removal of the functional coating film on the objective face (refer to FIG. 2).

In the present invention, since excellent surface smoothness can be achieved by high load, single-face polishing, some types of wafers are reusable after removing the functional coating film. When a reusable surface smoothness is not achieved by any functional coating film removal process among the step (b)(i) through (b)(iii) set forth above, the surface is subjected to high load, single-face polishing with a selected abrasive grain size and load to obtain a reusable surface smoothness.

When the functional coating film is present on the back face, the films on both faces are removed separately and the reused face is finished by mirror polishing.

Figure 2:
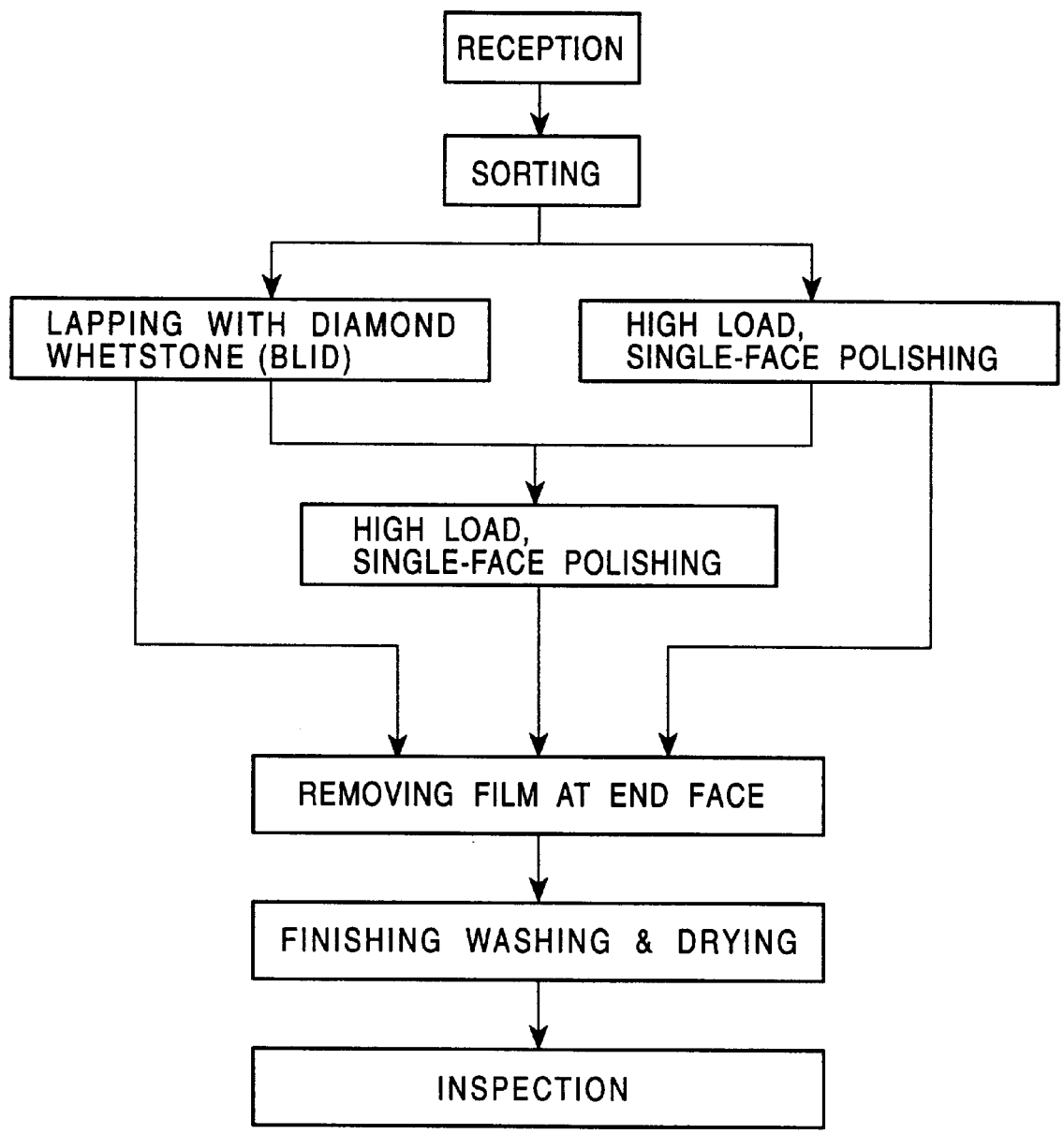
FIG. 2 is a flow chart illustrating a typical regeneration process in accordance with the present invention.

The test wafer surface after the surface polishing is washed by a batch process or multibath process, followed by drying in order to remove abrasive grains on the surface and to condition the surface. FIG. 2 is a flow chart illustrating a typical regeneration process in accordance with the present invention, wherein the (b)(iii) step is omitted.

A regeneration apparatus for performing the present invention comprises units of the above-mentioned (1) through (3) or (1) through (4). These units must be provided with mechanisms for performing the above-mentioned steps. For example, (1) the functional coating film removal unit must be provided with a holding rotation mechanism for rotating while holding the wafer, a working mechanism comprising a combination of electrolytic in-process dressing with a metal bonded whetstone or a polishing plate with a pad thereon, and an electrolyzing mechanism of the objective face in which the objective face is faced to an electrode in an electrolyte solution and a predetermined voltage is applied. (4) The surface polishing unit must be provided with a holding rotation mechanism for rotating while holding the wafer and a surface polishing mechanism comprising a polishing plate with a pad thereon.

In the present invention as set forth above, wafers and substrates can be regenerated with extremely small allowances by lapping with a combination of a metal bonded whetstone with electrolytic in-process dressing or by high load, single-face polishing using a fine abrasive grain slurry and a hard pad. Wafers after removal of functional coating films have mirror-polished or smooth surfaces as they are or after finish polishing, which are essential for wafer regeneration. The step numbers for regeneration can be reduced and some facilities such as a wax mounter are not necessary, resulting in reduction of facility investment and regeneration cost. Further, since the wafer is held by a single face, the wafer can be held by the back face and an automated system can be achieved.

EXAMPLES

The present invention will now be illustrated in more detail with reference to examples. These examples are not limited to the present invention, and it is to be understood that changes and variations may be made without departing from the spirit or scope of the present invention.

Example 1

Wafer A comprising an oxide film with a thickness of 100 angstroms formed on a single-crystal silicon with an outer diameter of 200 mm and a thickness of 0.75 mm, Wafer B comprising five layers of oxide film, W film, Ti—W film, TiSi film and polysilicon film, and Wafer C comprising six layers of oxide film, W film, Ti—W film, TiSi film, polysilicon film and $Si_3N_4$ film were used in Example 1. Each of these wafers was held by a single face with an air chuck, and subjected to removal of the functional coating film(s) with a metal bonded diamond whetstone. After removal of the functional coating film(s), the silicon wafer was used to evaluate the depth of working damage, the surface roughness and the TTV. The results summarized in Table 1 demonstrate that silicon wafers are effectively regenerated under appropriately selected conditions.

TABLE 1

| Example | 1-1 | 1-2 | 1-3 | 1-4 | 1-5 | 1-6 | 1-7 | 1-8 | 1-9 |
|---|---|---|---|---|---|---|---|---|---|
| Wafer | A, B, C | | | | A, B, C | | A, B, C | | A, B, C |
| Average size of diamond ($\mu$m) | 0.5 | 1.0 | 8.0 | 11.5 | 1.0 | | 1.0 | | 8.0 |
| Rotation speed of whetstone (rpm) | 2500 | | | | 500 | 6000 | 2500 | | 2500 |
| Rotation speed of wafer (rpm) | 200 | | | | | | 50 | 600 | 200 |
| Infeed speed ($\mu$m/min) | 3.0 | 4.0 | 5.0 | 5.0 | 4.0 | 4.0 | 4.0 | 4.0 | 5.0 |
| Depth of cut ($\mu$m) | 3.0 | 5.0 | 5.1 | 5.2 | 5.0 | 5.0 | 5.0 | 5.0 | 5.1 |
| Electrolytic in-process dressing | Applied | Applied | Applied | Applied | Applied | Applied | Applied | Applied | Not applied |
| Actual working allowance ($\mu$m) | 0.2 | 3.8 | 4.9 | 5.1 | 3.2 | 5.1 | 5.1 | 4.9 | 0.1 |
| Surface roughness Ra (Å) | — | 71 | 120 | 500 | 122 | 92 | 129 | 90 | — |
| TTV ($\mu$m) | — | 2.2 | 1.2 | 1.1 | 4.5 | 2.2 | 4.5 | 2.3 | — |
| Depth of working damage ($\mu$m) | — | 0.2 | 0.5 | 8.5 | 2.5 | 4.5 | 2.2 | 4.3 | — |
| Remarks | Film is not removed | — | — | Deep lapping trace | Deep lapping trace | Chipping occurs | Deep lapping trace | Chipping occurs | Film is not removed due to high lapping resistance |

Example 2

Each of Wafers A, B and C set forth in Example 1 was held by a single face with an air chuck, and polished by a high load, single-face polishing process under conditions shown in Table 2 in order to remove the functional coating film(s). The depth of working damage, roughness and TTV of the silicon wafer surface after removal of the functional coating film(s) were evaluated. The results summarized in Table 2 demonstrate that silicon wafers are effectively regenerated under appropriately selected conditions.

TABLE 2

| Example | 2-1 | 2-2 | 2-3 | 2-4 | 2-5 | 2-6 | 2-7 | 2-8 | 2-9 |
|---|---|---|---|---|---|---|---|---|---|
| Wafer | A | B | C | B | B | B | B | B | B |
| Pad hardness | 80 | 80 | 80 | 40 | 80 | 80 | 80 | 80 | 80 |
| Abrasive grain | $SiO_2$ | $SiO_2$ | $SiO_2$ | $SiO_2$ | $SiO_2$ | $SiO_2$ | $SiO_2$ | $SiO_2$ | $SiO_2$ |
| Abrasive grain size ($\mu$m) | 0.1 | 0.1 | 0.1 | 0.1 | 0.1 | 0.1 | 0.1 | 0.1 | 0.1 |
| Rotation speed of polishing plate (rpm) | 70 | 70 | 70 | 70 | 70 | 70 | 10 | 200 | 70 |
| Rotation speed of wafer (rpm) | 60 | 60 | 60 | 60 | 10 | 200 | 60 | 60 | 60 |
| Polishing load (g/cm$^2$) | 500 | 500 | 500 | 500 | 500 | 500 | 500 | 500 | 100 |
| Working allowance ($\mu$m) | 2.2 | 2.2 | 0.1 | 1.8 | 1.6 | 3.2 | 2.1 | 3.2 | 3.2 |
| Surface roughness (Å) | 20 | 23 | 28 | 33 | 34 | 26 | 29 | 24 | 33 |
| TTV ($\mu$m) | 2.3 | 2.3 | 2.3 | 5.5 | 5.5 | 1.8 | 4.8 | 1.9 | 3.2 |
| Remarks | — | — | Insufficient film removal | Low polishing speed | Low polishing speed | Scratch formation | Low polishing speed | Scratch formation | Scratch formation |

Example 3

Wafer D having an Al film was mounted on a wafer holder in an electrolytic solution. A glassy carbon electrode with an outer diameter of 210 mm and a thickness of 1 mm was mirror-polished so as to have a surface roughness Ra of 15 angstroms. The distance between the functional coating film and the carbon electrode was kept to 1 mm, and electrolysis was performed between the Wafer D and the electrode to remove the functional coating film. The wafer after removal of the functional coating film exhibited satisfactory surface roughness and TTV.

What is claimed is:

1. A method for regenerating a used wafer or substrate by removing a functional coating film formed on said used wafer or substrate, comprising:

(a) sorting said used wafer or substrate according to the quality, structure or thickness of said functional coating film;

(b) removing said functional coating film and preparing the wafer or substrate surface for mirror-polishing, while in a state of holding said used wafer or substrate, (i) by lapping the objective face of said used wafer or substrate with a hard metal-bonded whetstone while applying an electrochemical in-process dressing and while relatively rotating the lapping face and the whetstone, or (ii) by polishing said objective face while dropping a fine-particle polishing slurry containing polishing particles with an average size of 10.0 $\mu$m or less between a polishing plate provided with a pad and said functional coating film while relatively rotating the objective face and the pad and forcing the objective face onto the pad at a face load of 100 g/cm$^2$;

(c) mechanically removing said functional coating film adhered to the end face at an adequate stage; and (d) washing and drying said used wafer or substrate after removal of said functional coating film.

2. A method for regenerating a used wafer or substrate according to claim 1, wherein said objective face is mirror-polished by dropping a fine-particle polishing slurry between a polishing plate and said objective face while in a state of holding said used wafer or substrate, after step (b).

3. A method for regenerating a used wafer or substrate according to claim 1, wherein said step (b)(i) is performed while rotating said objective face at a rate of 500 to 600 rpm and while applying electrochemical in-process dressing with a cup metal-bonded diamond whetstone having a roughness of #2,000 to 10,000 and rotating at a rate of 500 to 6,000 rpm.

4. A method for regenerating a used wafer or substrate according to claim 1, wherein said step (b)(ii) is performed by dropping said fine-particle polishing slurry containing polishing particles with an average size of 10.0 μm or less onto the pad of said polishing slurry while rotating said objective face at a rate of 10 to 200 rpm, and by forcing said objective face onto said pad at a face load of 100 g/cm² or more while rotating said polishing plate at a rate of 10 to 200 rpm.

5. A method for regenerating a used wafer or substrate according to claim 4, wherein said fine-particle polishing slurry contains at least one abrasive grain substance selected form the group consisting of $SiO_2$, $Al_2O_3$ SiC, zirconia, cerium oxide, diamond and colloidal silica.

6. A method for regenerating a used wafer or substrate according to claim 5, wherein said fine-particle polishing slurry is an alkaline slurry with a pH of 7.2 or more.

7. A method for regenerating a used wafer or substrate according to claim 5, wherein said fine-particle polishing slurry contains hydrogen peroxide.

8. A method for regenerating a used wafer or substrate according to claim 4, wherein said fine-particle polishing slurry comprises $Al_2O_3$ polishing particles and a water-soluble inorganic substance being at least one oxidative aluminum salt selected from the group consisting of dichromate, nitrate and chloride.

9. A method for regenerating a used wafer or substrate according to claim 4, wherein said pad is a hard pad having a Shore hardness of 40 or more.

* * * * *